United States Patent
Kao et al.

(10) Patent No.: US 9,373,657 B2
(45) Date of Patent: Jun. 21, 2016

(54) SYSTEM AND METHOD FOR FABRICATING A 3D IMAGE SENSOR STRUCTURE

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Chun-Chieh Chuang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 97 days.

(21) Appl. No.: 14/163,060

(22) Filed: Jan. 24, 2014

(65) Prior Publication Data

US 2014/0138752 A1 May 22, 2014

Related U.S. Application Data (63) Continuation of application No. 13/572,436, filed on Aug. 10, 2012, now Pat. No. 8,669,135.

(51) Int. Cl.
*H01L 27/146* (2006.01)

(52) U.S. Cl.
CPC ...... *H01L 27/14634* (2013.01); *H01L 27/1464* (2013.01); *H01L 27/1469* (2013.01); *H01L 27/14643* (2013.01); *H01L 27/14689* (2013.01); *H01L 27/14696* (2013.01)

(58) Field of Classification Search
CPC .......... H01L 27/14634; H01L 27/1464; H01L 27/14643; H01L 27/14689; H01L 27/1469; H01L 27/14696
See application file for complete search history.

(56) References Cited

U.S. PATENT DOCUMENTS

| 7,417,268 B2 | 8/2008 | Cazaux et al. |
| 8,049,277 B2 | 11/2011 | Yu et al. |
| 8,164,126 B2 | 4/2012 | Moon et al. |

(Continued)

FOREIGN PATENT DOCUMENTS

KR   100825808 B1   4/2008

OTHER PUBLICATIONS

Johnson, J., "Hydrogen Ion-Implantation in Smart Cut SOI Fabrication Technique," 6.774 Term Project, 18 pgs, Dec. 7, 2009.

*Primary Examiner* — Whitney T Moore
*Assistant Examiner* — Joseph Galvin, III
(74) *Attorney, Agent, or Firm* — Slater Matsil, LLP (57) ABSTRACT

A system and method for fabricating a 3D image sensor structure is disclosed. The method comprises providing an image sensor with a backside illuminated photosensitive region on a substrate, applying a first dielectric layer to the first side of the substrate opposite the substrate side where image data is gathered, and applying a semiconductor layer that is optionally polysilicon, to the first dielectric layer. A least one control transistor may be created on the first dielectric layer, within the semiconductor layer and may optionally be a row select, reset or source follower transistor. An inter-metal dielectric may be applied over the first dielectric layer; and may have at least one metal interconnect disposed therein. A second interlevel dielectric layer may be disposed on the control transistors. The dielectric layers and semiconductor layer may be applied by bonding a wafer to the substrate or via deposition.

20 Claims, 5 Drawing Sheets

(56) References Cited

U.S. PATENT DOCUMENTS

| | | |
|---|---|---|
| 2007/0018075 A1 | 1/2007 | Cazaux et al. |
| 2007/0111546 A1 | 5/2007 | Iyer et al. |
| 2008/0203452 A1* | 8/2008 | Moon ............... H01L 27/14603 257/292 |
| 2008/0303112 A1 | 12/2008 | Uya |
| 2009/0309160 A1 | 12/2009 | Cohen et al. |
| 2010/0044706 A1 | 2/2010 | Hebras |
| 2010/0044758 A1 | 2/2010 | Cohen et al. |
| 2010/0096718 A1 | 4/2010 | Hynecek et al. |
| 2010/0148274 A1 | 6/2010 | Tai et al. |
| 2010/0176371 A1 | 7/2010 | Lochtefeld |
| 2010/0301447 A1 | 12/2010 | Yu et al. |
| 2011/0049336 A1* | 3/2011 | Matsunuma ...... H01L 27/14609 250/214.1 |
| 2012/0255600 A1 | 10/2012 | Bedell et al. |
| 2012/0322229 A1 | 12/2012 | Castex |

* cited by examiner

SYSTEM AND METHOD FOR FABRICATING A 3D IMAGE SENSOR STRUCTURE

PRIORITY CLAIM AND CROSS-REFERENCE

This application is a continuation of, and claims the benefit of, U.S. patent application Ser. No. 13/572,436, filed on Aug. 10, 2012, titled "System and Method for Fabricating a 3D Image Sensor Structure", which is hereby incorporated herein by reference.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixel sensors located in a substrate that may include photodiodes and transistors, and that can absorb radiation projected toward the substrate and convert the sensed radiation into electrical signals.

Photodiodes such as complementary metal oxide semiconductors (CMOS) diodes are commonly used for sensing images in cameras and other video or photo devices. Recently, photodiode devices have been improved by using backside illumination (BSI). A BSI image sensor device is one type of image sensor device using a photodiode having a photosensitive region that converts received electromagnetic energy, such as light, into electrical charge. Generally, photolithography processes deposit structures such as gate oxides, metal interconnects, and the like, on the top side of silicon wafer or other substrate. Early photodiodes gathered light from the top, the same side where the device structures were applied. Metal interconnects deposited on the top surface of the photodiode substrate can block portions of the photosensitive regions of the photodiode, degrading the picture quality and individual photodiode sensitivity.

These BSI image sensor devices are operable to detect light projected onto its backside. A BSI image sensor device has a relatively thin silicon substrate (e.g., a few microns thick) in which light-sensing pixels are formed. Ideally, the substrate thickness is reduced so that light may enter the backside of the device and strike the photosensitive region of the photodiode, eliminating obstruction and interference during image capture from deposited structures and metal interconnects. BSI is the collection of light from the backside of the photodiode substrate, with interfering structures such as metal interconnects, gate oxides or the like deposited onto the top side of the substrate, and then the substrate abraded or otherwise thinned to allow light to pass though the substrate and affect the photosensitive region of the photodiode. The quantum efficiency and the full well capacity of BSI image sensors may depend on the size of the radiation-sensing region. Thus, the ability to reduce the amount of interference derived from overlaying metal contacts increases the quantum efficiency of the image sensors by permitting more incident light to strike the photosensitive portions of the image sensor without being blocked by an overlying structure. Additionally, a larger photosensitive region and associated well for each image sensor permits a greater amount of light information to be collected. Therefore, a greater fill factor, or a greater ratio of photodiode area to overall die area, permits greater efficiency in image gathering for a given die size.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

The present principles are directed to, and method for making, an image sensor structure and device having increased full well capacity and fill factor. In particular, an apparatus and method are presented herein that is directed to improving the density of image sensors, such as photodiodes, by fabricating control transistors overlying the front side of the image sensors, opposite the sensors' image collecting surface.

Embodiments will be described with respect to a specific context, namely a system and method for fabricating a photodiode device with enhanced full well capacity and fill factor. While the principles presented herein are described herein as being applied to a photodiode for clarity, skilled practitioners will recognize that the presented principles are not limited to a single image sensor or photodiode, and may be used for wafer or chip level fabrication, or any other processing system. Other embodiments may also be applied, however, to other devices, including, but not limited to charge coupled devices, solar cells, light emitting diodes, display arrays, and the like.

In particularly useful embodiments of the presented principles, one CMOS active pixel sensor may consist of a four transistor cell, also called a 4T cell, with a photodetector (a pinned photodiode or the like), a transfer gate, reset gate, selection gate and source-follower readout transistor. The pinned photodiode, when coupled with the transfer gate, allows complete charge transfer from the pinned photo diode to the floating diffusion (which is further connected to the gate of the read-out transistor) eliminating lag. The reset transistor resets the photodetector's floating diffusion, removing charge and permitting the photodiode to capture a new image. When the reset transistor is turned on, the photodiode is effectively connected to the power supply, clearing all integrated charge. Since the reset transistor is n-type, the pixel operates in soft reset. The source follower transistor acts as a buffer or an amplifier which allows the pixel voltage to be observed without removing the accumulated charge. Thus, each photodiode has one or more control transistors associated with it, and predefined groups of photodiodes may have one or more group control transistors, such as column select transistors, associated with the group of transistors. A typical two-dimensional array of pixels is organized into rows and columns, and the row select transistor allows a single row of the pixel array to be read by the read-out electronics. Additional photodiode configurations are also known and used. For example, a 3T cell may be similar to a 4T cell, but lack a transfer gate, while a 5T or 6T cell may include a pre-charge or sample transistor.

Figure 1:
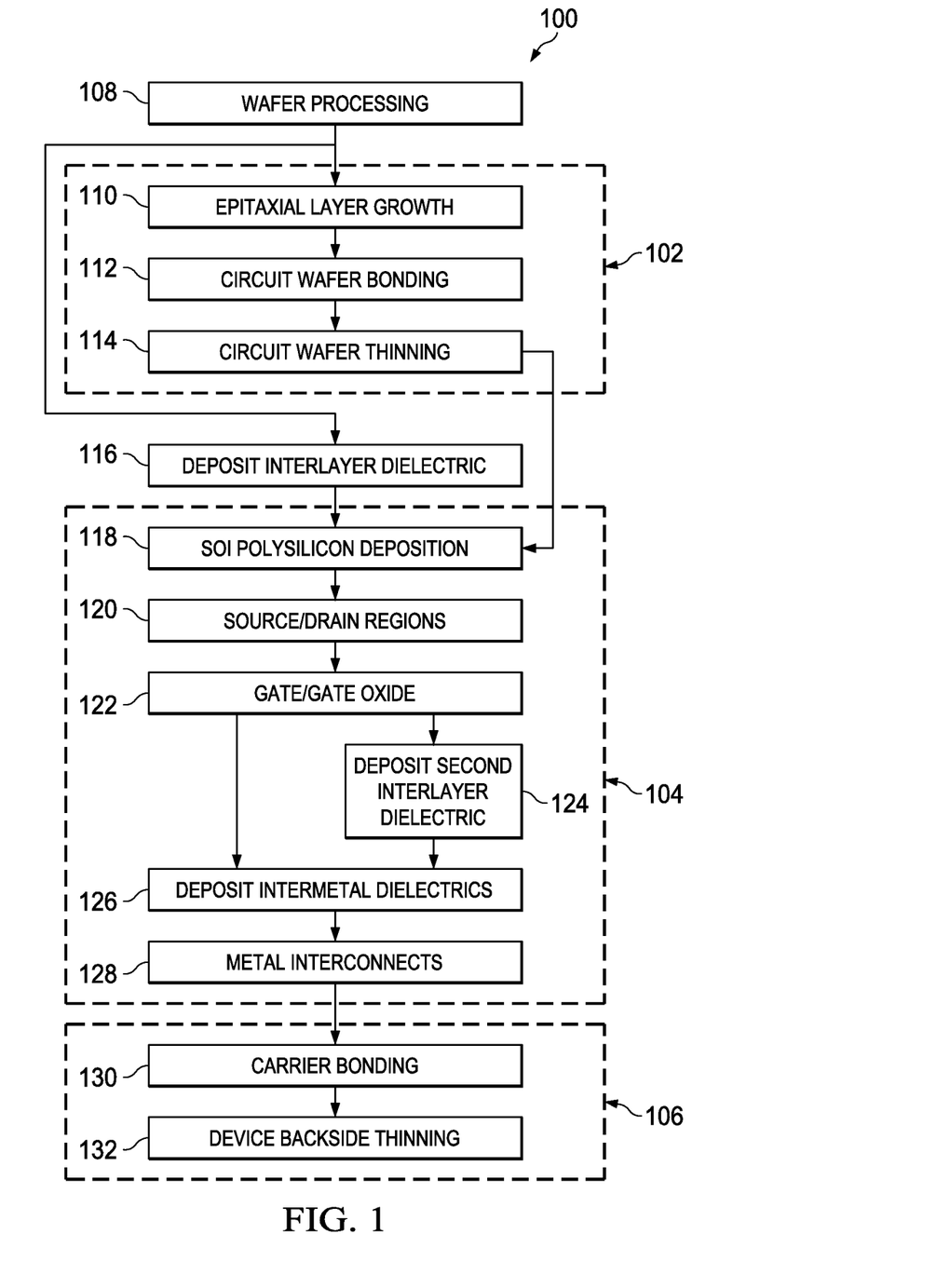
FIG. 1 is a flow diagram illustrating a method for processing an image sensing structure according to the presented principles; and in accordance with some embodiments.

With reference now to FIG. 1, a method 100 for processing an image sensing structure according to the presented principles is depicted. The method 100 is described with reference to the cross-sectional diagrams of FIGS. 2-10, which are drawn for illustrative purposes, and are not to scale.

Figure 2:
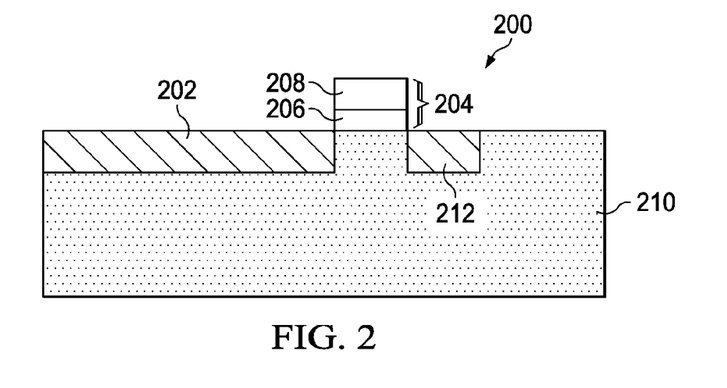
FIGS. 2-10 are cross-sectional views of an image sensor structure during processing according to the present principles.

Initially, in block 108, a wafer with one or more photodiodes, or other image sensing structures, may be created and processed for integration of frontside circuitry. FIG. 2 illustrates one embodiment of a photodiode 200 structure on a wafer. A photodiode 200 may be disposed on a wafer or substrate 210, with a photosensitive region 202 that may be implanted or otherwise doped using any appropriate method, whether known or as yet undiscovered. The photodiode 200 may have a transfer gate 204 comprised of a gate oxide 206 and gate contact 208. The transfer gate 204 may, in some embodiments, be used to transfer the charge from the photosensitive region 202 to a floating diffusion 212 to be read by charge sensing circuitry. One embodiment may have a photodetector that is a pinned photodiode 200 where the photosensitive region 202 is a heavily p-doped region over an n-doped region. The transfer gate 204 may treat the photosensitive region 202 as a transistor source and may span the photosensitive region 202 and a floating diffusion 212, such as an n+ doped region, in the substrate 210, such as a heavily n-doped drain region. Alternatively, the transfer gate 204 may span the photosensitive region 202 and a discretely defined drain region 212. Additionally, the photodiode 200 may have isolation structured or additional diffusion fields and gate transistors, for, by way of example, controlling excess charge and the blooming effect, where carriers may bleed into, or from adjacent photodiodes 200. The photosensitive region 202 may implanted next to a first surface of the wafer substrate 210, and the wafer substrate 210 may be thinned on the opposite, or second, side to prevent occlusions of the photosensitive region 202 by metal traces or interconnects.

An insulating or dielectric layer 302 may be deposited on the photodiode 202, followed by a semiconductor or silicon layer 402 on which the frontside circuitry may be fabricated. Block 102 illustrates a procedure for one embodiment of applying a second wafer to a photodiode wafer in preparation for frontside circuit formation. Block 104 illustrates a procedure for frontside circuit formation while block 106 illustrates a procedure for device finishing and device packaging.

In one embodiment, the insulating dielectric 302 and semiconductor layers 402 may be deposited by bonding a second wafer onto the photodiode 202 as shown in block 102. One or more epitaxial layers may be grown on a wafer substrate, or layers may be deposited or otherwise fabricated on a separate wafer, in block 110, and then the wafer may be bonded in block 112 to the photodiode 202. After bonding in block 112, the second wafer, or circuit wafer, may be thinned in block 114 to remove carrier material, or to achieve a desired or predetermined thickness in the semiconductor layer 402 or interlayer dielectric layer 302.

Figure 3:
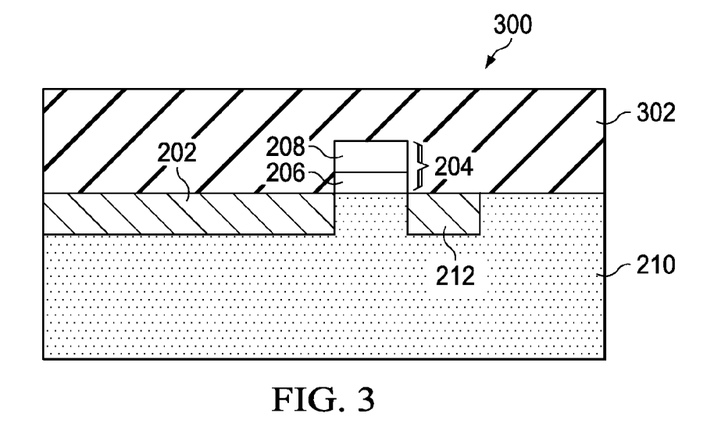

Alternatively, an insulator or interlayer dielectric layer 302 may be applied by bonding a wafer to the photodiode 200 and then a silicon layer may be deposited over that layer via epitaxy, deposition, or the like. FIG. 3 illustrates a structure 300 where a photodiode 200 has an insulating dielectric layer 302 applied.

In yet another alternative embodiment, the insulating layer 302, and any other layer, may be deposited directly in the photodiode 200, using any advantageous technique, including, but not limited to, chemical vapor deposition, epitaxy, atomic layer deposition, or the like. In one useful embodiment, an interlayer dielectric may be deposited in block 116 to create the insulator layer 302. A dielectric insulating layer 302 will preferably insulate the photodiode 200 electrically from any frontside components, but will also have a low k value, or low relative permittivity, to prevent cross talk or electromagnetic interference between devices or interconnect lines.

Block 104 illustrates a procedure for frontside circuit formation. A semiconductor layer 402, such as a silicon-on-insulator (SOI) polysilicon layer, may be deposited on the insulator layer 302 in block 118. In embodiments where wafer bonding is employed, the semiconductor layer 402 may be part of the wafer, and may be applied during the wafer bonding process of block 112. Additionally, the semiconductor layer 402 may be formed into discrete device regions or transistor substrates via photolithographic masking and etching, or via masking and selective deposition of the semiconductor layer 402.

Figure 4:
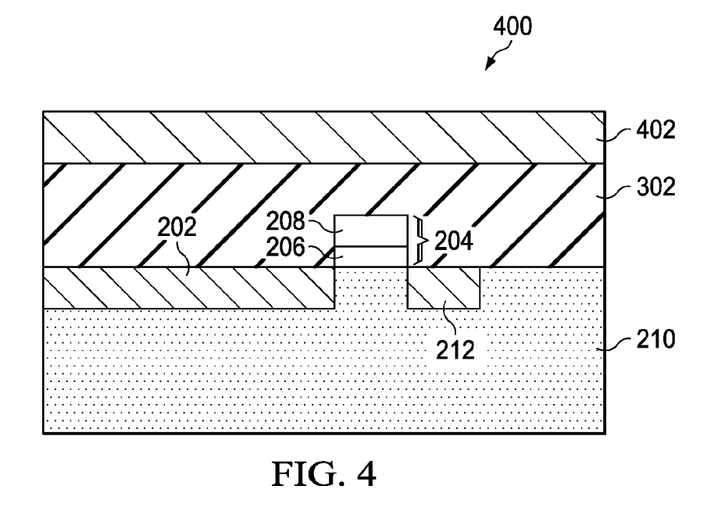

FIG. 4 illustrates a structure 400 with the semiconductor layer 402 applied to the insulator layer 302. In depositing the semiconductor layer 402, doping may be applied with the deposition process of block 118, or may be implanted. Thus, for example, the semiconductor substrate 402 may be deposited as a p-type, and an n-well created via ion implantation. Alternatively, the semiconductor layer 402 may be a part of the second wafer bonded to the substrate 210, and may be thinned, via chemical mechanical polishing, or the like, to a predetermined depth after bonding.

Figure 5:
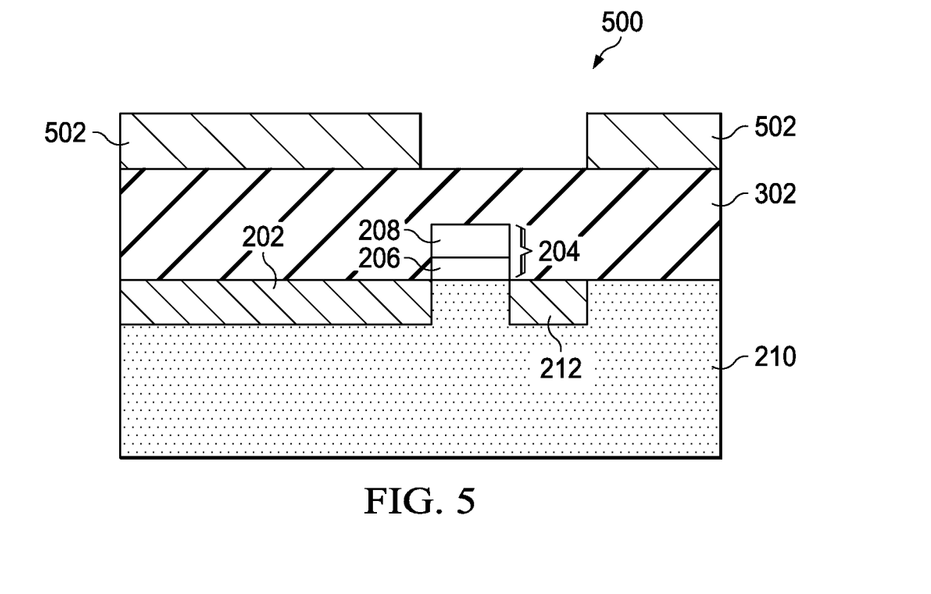
Figure 6:
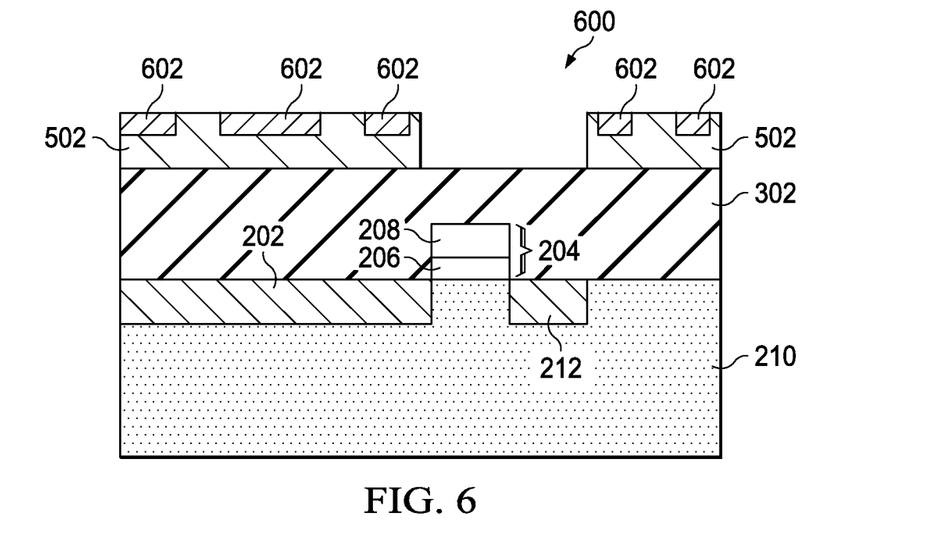

FIG. 5 illustrates a patterned semiconductor layer 502. The semiconductor layer 402 (Refer to FIG. 4) may be patterned to form a patterned semiconductor layer 502 and to define bulk or well regions for frontside circuits such as a reset gate, source follower and row select gate. Additionally, circuitry not specific to individual photodiodes 200 may be disposed on the frontside plane of the 3D structure. For example, column select gates, buffers or the like may be defined and disposed on the front side of the patterned semiconductor layer 502. After the semiconductor substrate is defined, source and drain regions 602 may, in block 120, be defined and created as shown in FIG. 6. A mask may be applied and the source and drain regions 602 created though ion implantation or another suitable doping technique.

Figure 7:
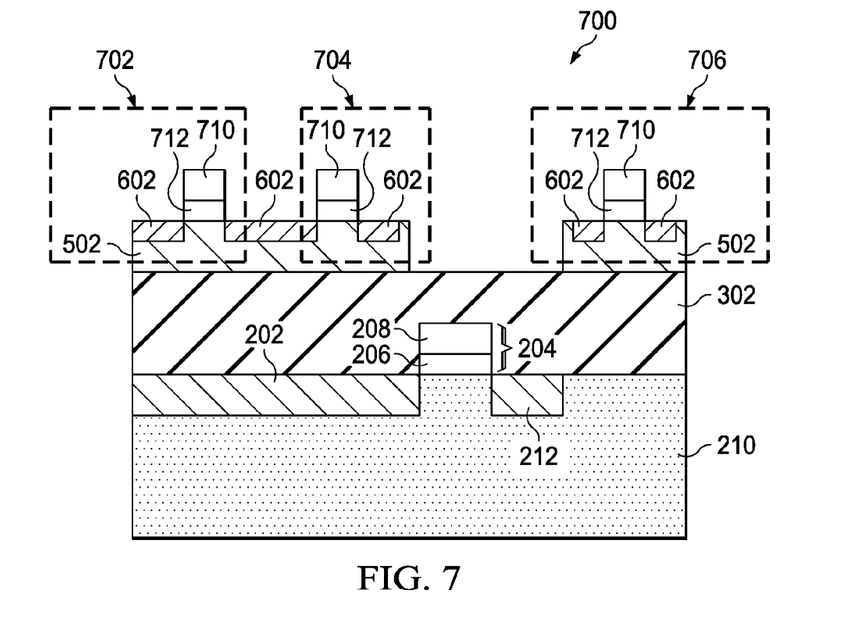

FIG. 7 illustrates a cross-section view of a photodiode 200 structure with frontside circuits disposed thereon. A gate oxide 712 and gate contact 710 may be defined in block 122, with a gate oxide 712 and gate contact 710 pair spanning a source and drain region 602 to defined a transistor channel and form a discrete transistor. In this manner, a row select transistor 702, source follower transistor 704 and reset transistor 706 are created. While the presented principles are described as having several front side transistors, including each of a row select transistor 702, source follower transistor 704 and reset transistor 706, skilled practitioners will recognize that additional transistors, such as a pre-charge transistor or sample transistor as in, for example, a 5T or 6T pixel sensor arrangement, may also be advantageously included in the frontside circuitry.

In particularly useful embodiments, the photosensitive region 202 of the photodiode 200 will fill the largest percentage of surface area possible, resulting in a greater fill factor and more sensitive image sensor. The frontside circuitry may be advantageously disposed on the frontside of the photodiode substrate surface to permit greater exposed surface area of the photodiode 200 through the photodiode's 200 backside, resulting in a greater light collection area for a given substrate area. Use of frontside circuitry, with the control transistors behind the photodiode instead of beside the photodiode, permits more of the substrate 210 to be dedicated to the photodiode 200 and the photosensitive region 202 in particular. Thus, a more sensitive photodiode array may be achieved without increasing the area of the photodiode 200 die. Additionally, a larger well under the photodiode 200 permits a greater charge to be accumulated at each photodiode 200 without overloading the charge well.

Additionally, with the frontside circuitry fabricated in separate steps from the photodiode 200 and transfer gate 204, the frontside circuitry fabrication process is not necessarily dependent on the fabrication process used to form the photodiode and transfer gate 204. Therefore, the fabrication process for the frontside circuitry may be tuned for optional performance without affecting the photodiode 200 performance. For example, the photodiode 200 and transfer gate 204 may be fabricated using a first fabrication technique, such as a 32 nanometer process, while the frontside circuitry may be fabricated using a second, different fabrication process, such as a 90 nanometer process. In such an embodiment, the larger frontside circuit fabrication process may be calculated to result in longer channels for the frontside circuitry transistors 702, 704 and 706, and less noise in those devices as a result.

Figure 8:
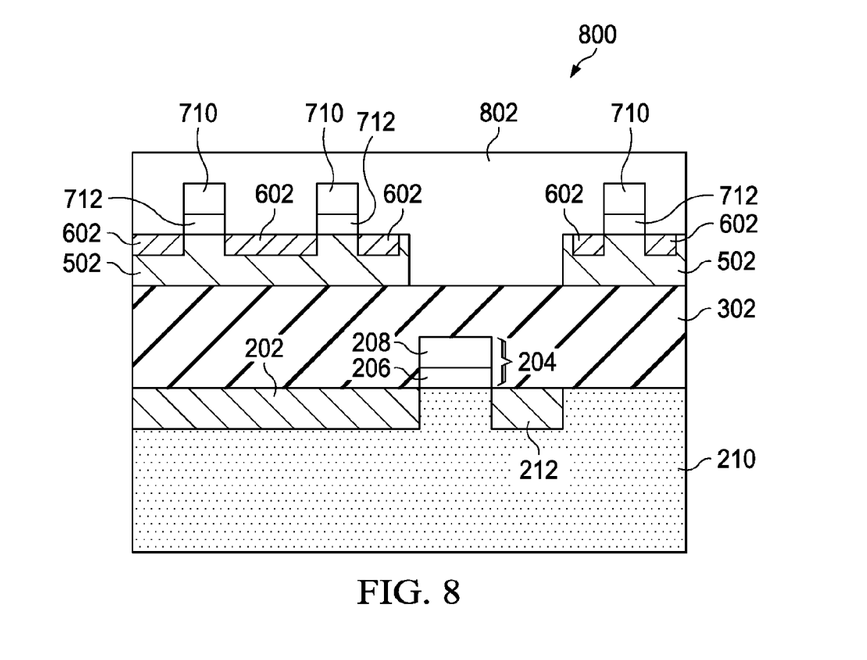

In one embodiment, a second interlayer dielectric layer 802 may optionally be deposited over the transistors 702, 704 and 706 in block 124 as shown in FIG. 8. Thus, the frontside control transistors 702, 704 and 706 may effectively be disposed within the interlayer dielectric layer 302 and 802 by being between the first and second dielectric layers 302 and 802, or the frontside circuit transistors 702, 704 and 706 may be disposed on the first interlayer dielectric 302.

Figure 9:
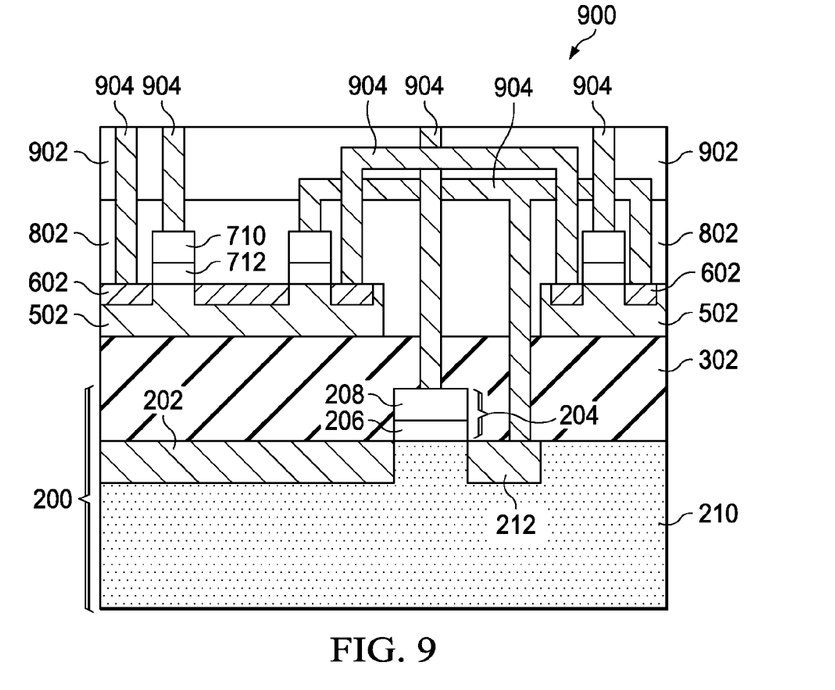

FIG. 9 illustrates a cross-section view of a photodiode 202 structure with an intermetal dielectric layer 902 and one or more metal interconnects 904 disposed over the frontside circuits. The intermetal dielectric layer 902 may be deposited on the first dielectric layer 302 in block 126. Alternatively, where a second interlayer dielectric layer 802 is applied in block 124, the intermetal dielectric layer 902 may be deposited on the second interlayer dielectric layer 802.

Metal interconnects 904 may be applied throughout the intermetal dielectric layer 902 in block 128. The metal interconnects 904 may be applied at the same time as the intermetal dielectric layer 902, with sub-layers of the intermetal dielectric layer 902 built up with metal interconnects 904 layered to connect the frontside transistors 702, 704 and 706 to each other, to the transfer gate 204 contacts, to the photodiode 202, and to other structures on the device, or to other, outside devices via a bonding pad, or the like. For example, an interconnect 904 may connect the source follower 704 to a bond pad wired to a memory device or processor for storage or processing of image data captured by the photosensor. Thus, the metal interconnects provide electrical connectivity between the frontside transistors, the photodiode and other devices.

In one embodiment, the lower portions of the metal interconnects 904 may be formed by masking and etching the insulating dielectric layer 302 and second dielectric layer 802 and then depositing a conductive material in the etched regions. The metal interconnects 904 extend to different depths within the structure, including to the transfer gate 204, the photodiode 200 substrate 210, the frontside transistor 702, 704 and 706, source and drain regions 602 and frontside transistor gate contacts 710. In order to effectively etch to the correct depths for the lower portions of the metal interconnects 904, multiple masking steps may be advantageously performed, and may be performed in combination with a multilevel intermetal dielectric layer 902 fabrication process. In one useful embodiment, frontside transistors may be applied on the first dielectric layer 302, followed by masking, etching and formation of the lower portions of the metal interconnects 904. The upper portions of the metal interconnects may then be formed in layers with a layered intermetal dielectric layer 902 applied over the transistors and first dielectric layer 302. Alternatively, in another embodiment, the frontside transistors 702, 704 and 706 may be disposed on the first interlayer dielectric layer 302 and under the second interlayer dielectric layer 802, which may both be etched using multiple contact masks or the like to create the lower portions of the metal interconnects 904. Formation of the interconnects 904 in place may be advantageous to formation of the transistors and interconnects on a separate wafer prior to bonding because requirements for alignment of bonding pads or interwafer interconnects may be eliminated.

Figure 10:
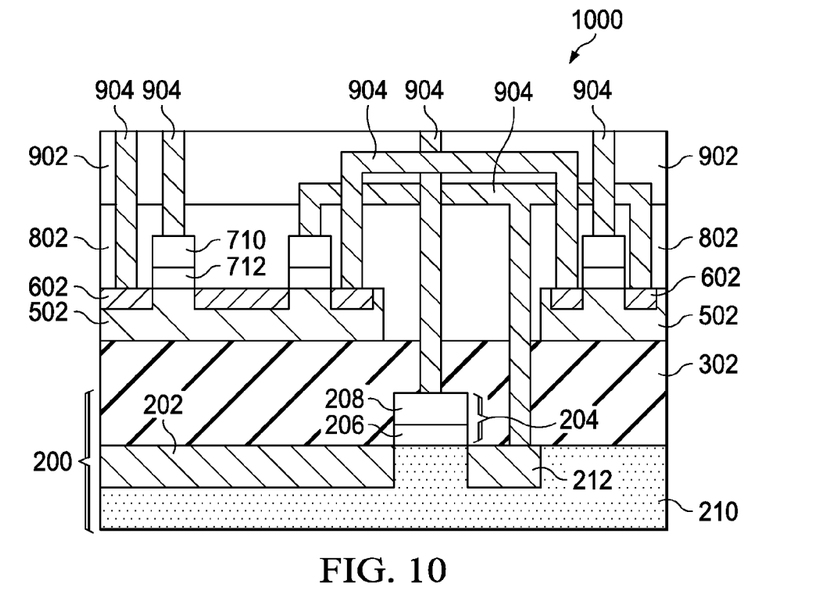

FIG. 10 illustrates a 3d image sensor structure 1000 after thinning the photodiode substrate 210. The photodiode substrate 210 may be thinned in block 132 to permit the photodiode 200 photosensitive region 202 to receive image data through the backside of the photodiode substrate 210. The thinning in block 132 may advantageously be performed after the image sensor structure 1000 is bonded to a carrier or other package in block 130 so that the bulk of the photodiode substrate 210 acts to support the image sensor structure during processing. Alternatively, the backside thinning of block 132 may be performed at an advantageous time during processing.

Although the present embodiments and their advantages have been described in detail, it should be understood that various changes, substitutions and alterations can be made herein without departing from the spirit and scope of the disclosure as defined by the appended claims. For example, bonding of the second wafer and application of the interlayer dielectric and semiconductor layers may be performed in a different order without deviating from the spirit of the presented principles.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
a substrate having an image sensor disposed thereon;
a first dielectric layer disposed on a first side of the substrate;
a semiconductor layer disposed on the first dielectric layer, the semiconductor layer having an opening extending therethrough;
a plurality of transistors disposed on the semiconductor layer;
a second dielectric layer disposed over at least one of the plurality of transistors, a portion of the second dielectric layer extending through the opening in the semiconductor layer and contacting the first dielectric layer;
a first vertical interconnect extending through the opening in the semiconductor layer and contacting a transfer gate of the image sensor and a second vertical interconnect extending through the opening in the semiconductor layer and contacting a floating diffusion region of the image sensor; and one or more interconnects disposed over the second dielectric layer, the one or more interconnects electrically connected to at least one of the plurality of transistors.

2. The device of claim 1, wherein each of the plurality of transistors is a control transistor, and wherein the second dielectric layer contacts the first dielectric layer between at least two of the plurality of control transistors.

3. The device of claim 2, wherein the semiconductor layer comprises a first portion and a second portion separated by an opening, the first portion and the second portion each having at least one of the plurality of control transistors disposed thereon.

4. The device of claim 2, wherein the plurality of control transistors comprises at least one of a source follower transistor, a row select transistor or a reset transistor.

5. The device of claim 2, wherein the image sensor comprises a transfer gate disposed on the first side of the substrate, the transfer gate configured to at least partially control the image sensor, wherein the first dielectric layer is disposed over the transfer gate.

6. The device of claim 5, wherein the one or more interconnects provide electrical connectivity between at least one of the plurality of control transistors and one of the image sensor, the transfer gate or another one of the plurality of control transistors.

7. The device of claim 1, wherein the image sensor is a backside illuminated image sensor.

8. The device of claim 1, wherein the first dielectric layer is an first interlayer dielectric layer (ILD), and wherein the second dielectric layer is a second ILD, the device further comprising an intermetal dielectric layer (IMD) disposed over the first ILD and the second ILD, a first portion of the one or more interconnects dispose in the IMD, a first portion of the one or more interconnects extending through the first ILD and the second ILD.

9. A device comprising:
an image sensor having a photosensitive region, the image sensor including a floating diffusion region and a transfer gate;
a semiconductor layer disposed over the image sensor and having opening extending from a first side of the semiconductor layer to a second side of the semiconductor layer opposite the first side, the opening being vertically over and aligned to both the floating diffusion region and the transfer gate;
a plurality of control transistors disposed on the semiconductor layer; and
a first interlayer dielectric layer (ILD) disposed over at least one of the plurality of control transistors, a first portion of the first ILD extending through the opening; and
one or more interconnects, at least a first interconnect portion of the one or more interconnects disposed over the first ILD, and at least a second portion of the one or more interconnections extending through the first portion of the first ILD and electrically connecting to the image sensor.

10. The device of claim 9, further comprising a second ILD disposed over the image sensor, wherein the semiconductor layer is disposed over the second ILD.

11. The device of claim 10, wherein the first portion of the first ILD contacts the second ILD.

12. The device of claim 11, wherein the first portion of the first ILD is disposed between the first interconnect portion and the semiconductor layer, the second interconnect portion avoiding contact with the semiconductor layer.

13. The device of claim 11, further comprising an intermetal dielectric layer (IMD) disposed over the first ILD and extending over the opening, at least the first interconnect portion of the one or more interconnects disposed in the IMD.

14. The device of claim 9, wherein the semiconductor layer comprises a first semiconductor portion and a second semiconductor portion, the opening disposed between the first semiconductor portion and the second semiconductor portion, the first semiconductor portion and the second semiconductor portion each having at least one of the plurality of control transistors disposed thereon.

15. The device of claim 9, wherein the plurality of control transistors comprises at least one of a source follower transistor, a row select transistor or a reset transistor.

16. The device of claim 9, wherein the one or more interconnects provide electrical connectivity between the image sensor and at least one of the plurality of control transistors.

17. A method, comprising:
forming an image sensor on a first side of a substrate, the image sensor having a photosensitive region disposed at the first side of the substrate;
forming a first dielectric layer over the first side of the substrate;
bonding a front side of a second substrate to the first dielectric layer and thinning back a back side of the second substrate;
forming an opening extending from the front side through the back side of the second substrate;
forming at least one transistor on the semiconductor layer; and
forming a second dielectric layer over the at least one transistor and the semiconductor layer, the second dielectric layer having a first portion extending through the opening in the semiconductor layer.

18. The method of claim 17, further comprising forming a plurality of interconnects over the semiconductor layer, at least a one interconnect of the plurality of interconnects extending through the first portion and electrically connecting a portion of the image sensor to the at least one transistor.

19. The method of claim 18, wherein forming the plurality of interconnects comprises forming the plurality of interconnects to connect the at least one transistor as at least one of a source follower transistor, a row select transistor or a reset transistor.

20. The method of claim 17, wherein the first portion contacts the first dielectric layer.

* * * * *